United States Patent [19]

Kaneko et al.

[11] Patent Number: 5,286,711
[45] Date of Patent: Feb. 15, 1994

[54] METHOD OF PRODUCING OXIDE SUPERCONDUCTOR

[75] Inventors: Hiroko Kaneko; Keiji Kaneko; Hideo Ihara, all of Tsukuba; Akira Negishi, Matsudo, all of Japan

[73] Assignee: Agency of Industrial Science & Technology, Ministry of International Trade & Industry, Tokyo, Japan

[21] Appl. No.: 856,378

[22] Filed: Mar. 23, 1992

[30] Foreign Application Priority Data

Jun. 21, 1991 [JP] Japan .................. 3-177257

[51] Int. Cl.$^5$ .................................. H01B 12/00
[52] U.S. Cl. ........................ 505/1; 205/51; 205/83
[58] Field of Search ............... 205/83, 51; 505/1

[56] References Cited

U.S. PATENT DOCUMENTS 5,157,581 10/1992 Hashemi .................. 361/321

OTHER PUBLICATIONS

Grenier, J-C. et al., Physica C, 173 (1991), pp. 139-144.
Schlenoff, J. B. et al., Physica C, 180 (1991), pp. 387-393.

Primary Examiner—John Niebling
Assistant Examiner—Kishor Mayekar
Attorney, Agent, or Firm—Oblon, Spivak, McClelland, Maier & Neustadt

[57] ABSTRACT

A method for producing an oxide superconductor comprises obtaining a cyclic voltammogram using an oxide material containing an element having a redox charge as an electrode, determining an electrolytic potential for the oxide material on the basis of the voltammogram, and electrolyzing the oxide material at the determined potential.

12 Claims, 5 Drawing Sheets

2θ

2θ

METHOD OF PRODUCING OXIDE SUPERCONDUCTOR

BACKGROUND OF THE INVENTION

1. Field of the Invention

This invention relates to a method of producing an oxide superconductor, more particularly to a method of producing an oxide superconductor which increases the critical temperature at which superconductivity is exhibited by an oxide containing copper, bismuth, vanadium or other element having a redox charge.

2. Prior Art Statement

Following the discovery by J. G. Bednorz and K. A. Müller of the original oxide superconductor consisting primarily of copper, there have been developed a number of other oxide superconductors which, owing to the incorporation and combination of various metal oxides, exhibit superconductivity at higher critical temperatures.

The oxide superconductors discovered up to now include at least one element having a redox charge among their constituent metal elements. Moreover, it is known that the element or elements are simultaneously present in different charge states at different portions of one and the same superconductor and that where these different charge states are regulated by oxygen, the oxygen atoms are usually not present in an integer ratio to the metal atoms. It is therefore thought that this presence of oxygen atoms at a non-integer ratio, or the variation in valence number corresponding to the number of metal element atoms, has an effect on the characteristics of the superconductor and its critical temperature.

In the production of superconductors consisting predominantly of copper, therefore, substances exhibiting different charges, such as oxides of rare earth metals, alkaline earth metals, bismuth and the like, have been added to the copper to regulate its valence number.

It is also believed that in oxide superconductors containing an element or elements having a redox charge such as bismuth (V) or vanadium (IV), the element or elements has/have an effect on the critical temperature at which superconductivity is exhibited.

Thus while numerous attempts have been made to develop new superconductors, the lack of any theoretical guidelines for increasing the superconducting critical temperature gives researchers engaged in such development no choice but to rely on the experience they accrue through their work.

On the other hand it has been reported that a superconductor with a critical temperature of 40 K. was obtained by electrochemically oxidizing a lanthanum-copper-oxygen (La-Cu-O) superconductor in a aqueous solution at 0.45 V (vs a mercury oxide electrode). (J-C. Grenier et al., Physica C 1991 p139-144.)

When a superconductor precursor oxide is electrochemically processed in an aqueous solution, the electrolytic potential of the oxide becomes a highly important factor. This will be explained using a La-Cu-O oxide as an example.

If a potential exceeding the appropriate potential range on the positive electrode is applied to the oxide, the generation of oxygen at the oxide surface will become so vigorous as to produce cracks in or even disintegrate the oxide serving as an electrode. Far from achieving introduction of oxygen, the conductivity of the oxide will be reduced. If an excessive negative potential is applied to the oxide, oxygen production will decline and generation of hydrogen will be induced, so that the conductivity of the once superconductive oxide will decline to the point where it loses its superconductivity altogether.

Grenier et al. state that they oxidized the composition at 0.45 V (vs a mercury oxide electrode) in light of the pH potential diagram of copper. However, when the inventors electrolyzed a La-Cu-O oxide of the same composition at the same electrolytic potential, they found that the conductivity of the oxide was reduced and that the critical temperature, Tc, usually exhibited provided the oxide is a superconductor, was not found and that the broad split width on X-ray spectrograms usually exhibited by a La-Cu-O oxide superconductor with a high critical temperature, Tc, was also reduced.

The object of this invention is to provide a method for producing an oxide superconductor which effectively and reliably enables the critical temperature of the superconductor to be increased.

SUMMARY OF THE INVENTION

For achieving this object, the present invention provides a method for producing an oxide superconductor comprising obtaining a cyclic voltammogram using an oxide material containing an element having a redox charge as an electrode, determining an electrolytic potential for electrochemically processing the oxide material on the basis of the voltammogram, and electrolyzing the oxide material at the determined potential.

This method according to the invention makes it possible to obtain an oxide superconductor whose critical temperature is effectively increased by first obtaining a cyclic voltammogram of an oxide material, selecting on the basis of the cyclic voltammogram a potential at which the difference between the amount of oxidization current and the amount of reduction current is large and at which at least one of the oxidization and the reduction current flows, and then electrolyzing the oxide material at the selected potential for a prescribed period of time.

Since the invention determines the electrolytic potential from the cyclic voltammogram (hereinafter called the C.V. curve) of the oxide material, the optimum electrolytic potential for the oxide material can be determined irrespective of what element having a redox charge is contained in the oxide material. It is therefore able to achieve an increase in the critical temperature of the oxide material effectively and with high reliability.

The above and other features of the present invention will become apparent from the following description made with reference to the drawings.

BRIEF DESCRIPTION OF THE DRAWINGS

FIG. 4($b$), is a graph showing the x-ray diffraction pattern of the material of FIG. 4($a$) after electrolysis.

DESCRIPTION OF THE PREFERRED EMBODIMENTS

Although copper does not generally dissolve in an alkaline solution owing to its conversion to a hydroxide, it undergoes the following redox reaction and assumes a trivalent state when electrochemically oxidized at a potential higher than the standard oxidization-reduction potential (0.8 V vs a normal hydrogen electrode):

However, even if a La-Cu-O oxide material that has been made in a desired form and sintered is electrochemically processed as an electrode in an aqueous solution at the standard oxidation-reduction potential, it does not already increase in critical temperature and does not always become a superconductor. In such a case it is therefore not possible to use this method for increasing the critical temperature of the oxide.

Moreover, in the case of oxides containing bismuth, vanadium and the like, the valence number at which superconductivity is exhibited, differs with the redox potential and, therefore, it is not possible to set a suitable electrolytic potential by selecting only from the standard redox potentials of each element. In the case of an oxide containing bismuth or the like, for example, conductivity is increased by electrolysis at near the hydrogen evolution potential.

Therefore, for obtaining an oxide superconductor with an increased critical temperature, in the present invention a C.V. curve is obtained using an oxide material containing copper, bismuth, vanadium or other such element having a redox charge as an electrode. After determining an appropriate electrolytic potential with the help of this C.V. curve, the oxide material is electrochemically processed at the so-determined potential.

Figure 1:
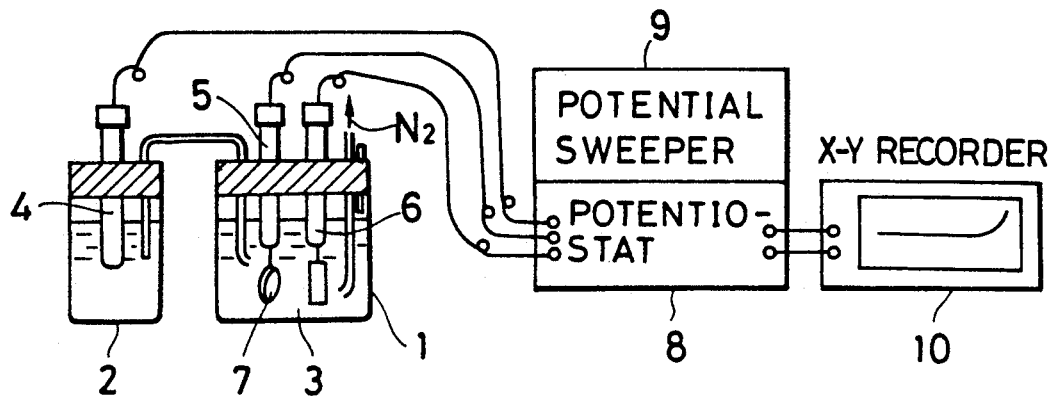
FIG. 1 is a schematic view of an example of an electrolytic apparatus for obtaining the C.V. curve of an oxide material and for electrolyzing the same.

FIG. 1 shows an example of an apparatus used in this invention for obtaining the C.V. curve of the oxide material and also for electrolyzing the oxide material. In this apparatus, a working electrode 5 and a platinum electrode 6 are disposed to face each other in a first electrolytic cell 1 containing main electrolytic solution 3. An oxide material 7 is suspended from the bottom of the working electrode 5. A saturated calomel electrode (SCE) 4 is provided in a second cell 2 as a reference electrode connected with a salt bridge. The electrodes 4, 5 and 6 are electrically connected with a potentiostat 8 and are applied with precisely controlled voltages by a potential sweeper 9.

As oxide materials to which this invention can be applied there can be mentioned oxides which contain at least one of copper, bismuth, vanadium or other such element having a redox charge and which are not soluble in an aqueous solution (the electrolyte). Specifically, as copper containing oxides meeting this description there can be mentioned those constituted as rare earth element (La, Y, Ce, Nd, Sm etc.)—alkaline earth element (Ba, Sr, Ca etc.)—copper-oxygen oxides, typical of which are La-Cu-O and Y-Ba-Cu-O. These oxide materials include compositions having alkali metal ions, alkaline earth metal ions, rare earth metal ions, hydroxide ions, sulfate ions, halogen compound ions or other types of ions which can be expected to improve conductivity intercalated between the oxide layers. The intercalation of these ions is achieved by causing the ions to be present in the electrolyte.

The oxide materials are obtained by blending the starting materials in a prescribed ratio, comminuting the mixture into a fine powder, forming the powder into disks, pellets or other appropriate shaped pieces, and sintering the shaped pieces by heat treatment in air or the like.

As the first electrolyte 3 contained in the main electrolytic cell 1 there can be used one consisting of, for example, an alkali or salt dissolved in water or an organic solvent such as alcohol, or a conductive solution consisting of, for example, a potassium hydroxide-sodium hydroxide fused solution or other such solution of fused salts of low fusion temperature. The alkali added to the aqueous solution or the organic solvent is preferably potassium hydroxide, sodium hydroxide, barium hydroxide, calcium hydroxide, magnesium hydroxide or strontium hydroxide. As the salt added thereto there can be used any of such soluble salts as chlorides, sulfates carbonates and the like of the aforesaid hydroxides.

As illustrated in FIG. 1, the oxide material 7 is suspended to contact with the working electrode 5 so as to face the platinum electrode 6 when the two electrodes are immersed in the first electrolyte 3 contained in the main electrolytic cell 1. The potential applied across the electrodes 5 and 6 is swept over a prescribed voltage range and the C.V. curve of the oxide material 7 is output to an x-y recorder 10.

The prescribed voltage range of the applied voltage extends about 0.5 V to either side of the standard oxidation or reduction voltage of the target redox ions contained in the material.

Figure 2:
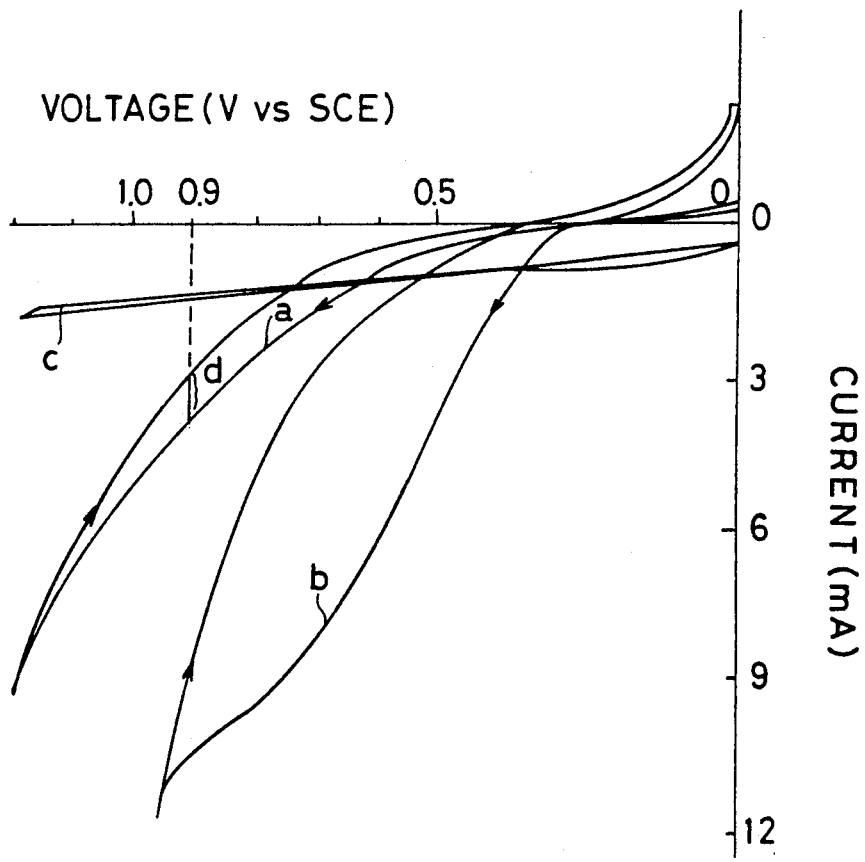
FIG. 2 is a graph showing C.V. curves of La-Cu-O oxide materials.

The curve a in FIG. 2 is an example of a C.V. curve obtained for a La-Cu material (measuring 20 mm in diameter and 1 mm in thickness).

The criteria used when the electrolytic potential for imparting the oxide material with superconductivity is determined from this C.V. curve are (1) that the difference d between the oxidization current and the reduction current on the C.V. curve be as large as possible, (2) that among the potentials satisfying criterium (1), the potential be one at which at least one of the oxidization and the reduction current flows, and (3) that among the potentials determined according to the criteria (1) and (2), there be used the highest one at which no vigorous production of oxygen gas from the material is visually observed.

The significance of the large difference between the oxidization current and the reduction current stipulated by the criterium (1) is that on the positive side of the graph the rate of reduction is small in comparison with the rate of oxidization, meaning that there is a corresponding increase in the amount of oxygen taken in for making the copper trivalent. The criterium (2) is established in light of the fact that the flow of either oxidization or reduction current indicates that either oxidation or reduction reaction is occurring on the electrode. The criterium (3) is established because visual observation of oxygen gas produced from the material indicates that oxygen is at least not being introduced efficiently into the material and that it is necessary to lower the potential.

As the another criterium, the standard electrode potential of the target element can be used. In the case of copper, for example, it is 0.8 V vs NHE (normal hydrogen electrode). As a general norm for the potential at which electrolysis of materials containing other redox elements except for copper should be performed, it is also possible to use the potential given by the table of standard electrode potentials. However, it is better to find a more practical electrolytic potential on the basis of the C.V. curves obtained in the range of about $+/-0.5$ V centering around the standard electrode potential of the target element. The reason for this is that the shapes of the C.V. curves of the oxide from the same material are subtly different.

When the aforesaid criteria are applied to the C.V. curve a in FIG. 2, the conclusion becomes that the potential for most effectively increasing the critical temperature of the oxide material lies in the range of 0.7–1.0 V, where the difference d between the oxidization current and the reduction current is large. However, since the efficiency of the processing increases with the potential used insofar as vigorous generation of oxygen does not occur, the most preferable electrolytic potential falls in the vicinity of 1.0–0.9 V.

Once the electrolytic potential has been determined in the foregoing manner, the potential sweeper 9 is operated to adjust the voltage applied to the electrodes 4, 5 and 6 via the potentiostat 8 to the determined potential (1.0–0.9 V), thus initiating electrolysis. If vigorous generation of oxygen from the material is visually observed after the start of the electrolysis, this means that the potential is inappropriate. In such a case, the processing is halted and the applied voltage is lowered to one at which vigorous oxygen production does not occur.

The duration of the processing had best be determined with reference to the current value, because the current value varies with the composition, dimensions, etc. of the material. Specifically, the current first increases with the passage of time following the start of electrolysis, reaches its peak and then declines. The electrolysis is terminated as soon as the current goes over its peak.

Figure 3:
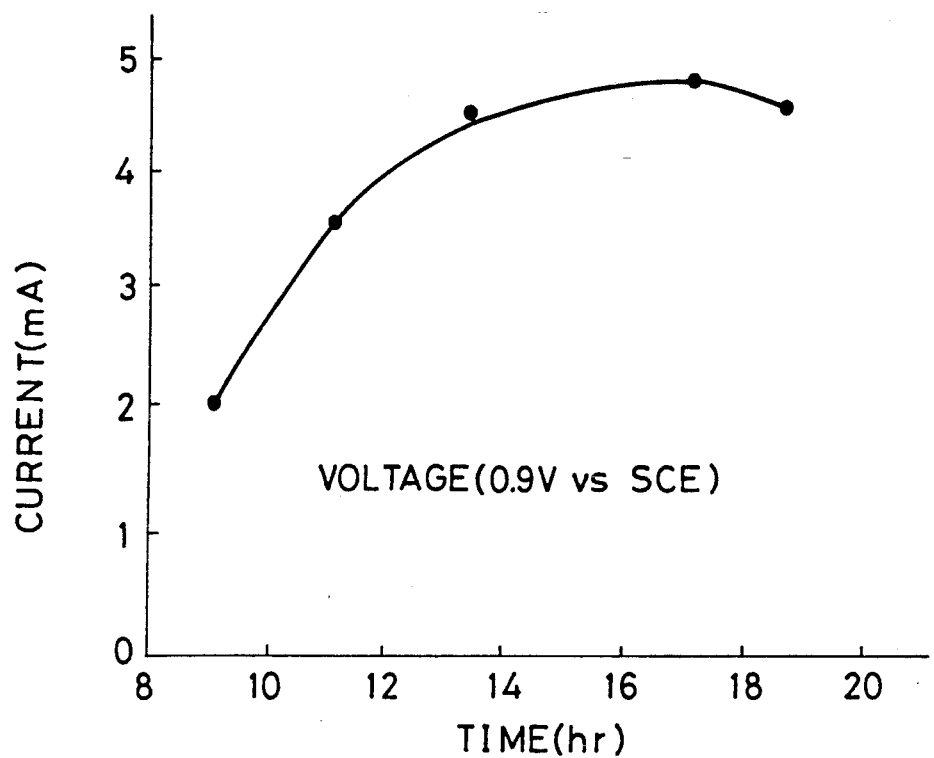
FIG. 3 is a graph showing the duration of variable current during electrolysis of a La-Cu-O oxide material.

An example of how the current changes as the electrolysis proceeds is shown in the graph of FIG. 3, which based on data obtained in the electrolysis of a La-Cu-O material at 0.9 V. After increasing sharply for about 13 hr following the start of electrolysis, the current increased gradually from this point for 4 hours and then began to fall. In the case of this material, therefore, the appropriate processing time is 15–17 hours.

The aforesaid electrolysis regulates the valence number of elements having a redox charge contained in the oxide, thus increasing the critical temperature at which the oxide exhibits superconductivity. The inventors measured the amount of oxygen contained in superconductors whose critical temperatures were increased by electrolysis to levels higher than that before electrolysis and found that copper containing materials showed an increase in oxygen content compared with the content prior to the processing, while bismuth and vanadium containing materials showed a decrease in oxygen content. From this it will be understood that it is likewise possible to apply the invention to other oxide materials containing at least one of copper, bismuth, vanadium or other such element having a redox charge. Specifically, by operating such a material as an electrode under prescribed potential conditions for generating a small amount of oxygen or hydrogen, the oxygen content of the oxide operated as an electrode can be increased or decreased so as to produce an oxide superconductor exhibiting an increased critical temperature. In this case, the electrolysis is preferably performed with respect to oxides which have a high oxygen content (such as copper type oxides) at a potential causing generation of a small amount of oxygen and with respect to oxides which have a low oxygen content (such as bismuth type oxides) at a potential causing generation of a small amount of hydrogen.

The inventors used x-ray diffraction analysis for examining the structures of oxide superconductors whose critical temperatures had been increased by regulating their oxygen content and the valence number of one or more elements contained therein in accordance with this invention. They found, for example, that the characteristic diffraction pattern of a La-Cu-O material processed according to the invention exhibited an increase in the split width that characterizes a superconductor structure.

As explained in the foregoing, when, in accordance with this invention, an oxide material is electrolyzed at a potential determined on the basis of a C.V. curve obtained for the oxide in advance, it is found that, in comparison with the oxide before the processing, processed oxide exhibits (1) increased conductivity, (2) an increase in oxidization or reduction reaction as determined from the C.V. curve, (3) an increase or decrease in the valence number of the redox element(s), (4) an increase or decrease in oxygen content of the oxide, and (5) an increase or decrease in the lattice constant of the characteristic curve of the x-ray diffraction pattern, all of which are considered to be factors contributing to an increase in the critical temperature of an oxide containing one or more elements having a redox charge.

One lanthanum-copper-oxygen superconductor obtained in accordance with the present invention exhibited a critical temperature of 40 K., which is about the same as the critical temperature of the lanthanum-alkaline earth metal-copper oxide superconductor that is obtained by replacing a part of the lanthanum of a lanthanum-copper superconductor with an alkaline earth element. The fact that the method of this invention was able to produce a lanthanum-copper oxide that exhibited a critical temperature of 40 K. notwithstanding that it contained no alkaline earth element establishes it as a revolutionary advance among methods for the processing of materials of this type.

Moreover, many alkaline earth metal containing in superconductive oxides have the problem of being degraded by moisture present in the air. In the present invention, however, since superconductivity is imparted in an aqueous solution, the resulting superconductive oxide is stable in atmospheric air and, as such, has extremely high practical utility.

Further, since the present invention can be considered to be particularly effective as regards electrolysis of the surface portions in direct contact with the electrolyte, it constitutes an efficient method for increasing the critical temperature of oxide superconductors in the state of thin films.

While the main way used for increasing the critical temperature, Tc, of oxide materials has been to electrolyze the materials at a suitable potential derived from C.V. curves obtained in an alkaline aqueous solution, the electrolysis in an electrolytic solvent obtained by dissolving an alkali or salt in alcohol or other such organic solvent having a high dielectric constant is also effective for increasing the Tc of oxide materials. Specifically, as the organic solvents, alcohols such as ethanol and methanol, acetonitrile, dimethylformamide, dimethylsulfoxide, propylene carbonate or other electrically conductive organic solvents are more effective. Another way to increase the Tc has been to electrolyze the materials in fused salts such as an eutectic mixture of potassium chloride, aluminum chloride and sodium chloride, which exhibits a low fusion temperature (eutectic temperature: 84.5° C.).

While the invention will now be explained with reference to specific working examples, it should be understood that the invention is in no way limited to these examples.

EXAMPLE 1

0.49 g of copper oxide (II) and 2.01 g of lanthanum oxide were pulverized, blended and formed into disks which were placed in an electric furnace and sintered in air by raising the furnace temperature to 1030° C. The disks obtained were comminuted into a fine powder and the powder was mixed and formed into disks each measuring 20 mm in diameter and 2 mm in thickness. The disks were placed in an electric furnace and sintered in air for 24 hours at a temperature of 1050° C.

One of the sintered disks, indicated as the La-Cu-O oxide material 7 in FIG. 1, was suspended from the bottom of the working electrode 5 of the apparatus shown in FIG. 1 so as to face the platinum electrode 6. The electrolyte in the main electrolytic cell 1 was a 1.0M KOH solution and that in the second electrolytic cell 2 was saturated KCl solution. A voltage of 1 V was applied across the working electrode 5 and the platinum electrode 6. The level of the applied potential was precisely controlled by the potentiostat 8 using the saturated calomel electrode 4 in the second electrolytic cell 2 as a reference electrode.

The C.V. curve of the oxide material 7 obtained in this manner is indicated as a in the graph of FIG. 2. Based on this C.V. curve a, the potential range satisfying the condition of a large difference d between the oxidization current and the reduction current and also the condition of the presence of an oxidization current was determined as 0.7–1.0 V (vs the saturated calomel electrode) and this range was selected as the potential range of candidate oxide material for electrochemical processing.

With the disk of oxide material 7 still suspended from the working electrode 5, only the potential applied between the working electrode 5 and the platinum electrode 6 was adjusted to 0.9 V by means of the potential sweeper and potentiostat 8, 9, and the oxide material 7 was electrolyzed for 10 hours at this potential. Little generation of oxygen from the material was observed during the electrolysis.

The C.V. curve of the processed oxide material is designated by b in FIG. 2. In this curve b, the value of the reduction current is much smaller in comparison with the oxidization curve than it is in the C.V. curve of the oxide material before processing, indicating that the material was oxidized, specifically that the copper in the material was oxidized into a trivalent state.

Figure 4A:
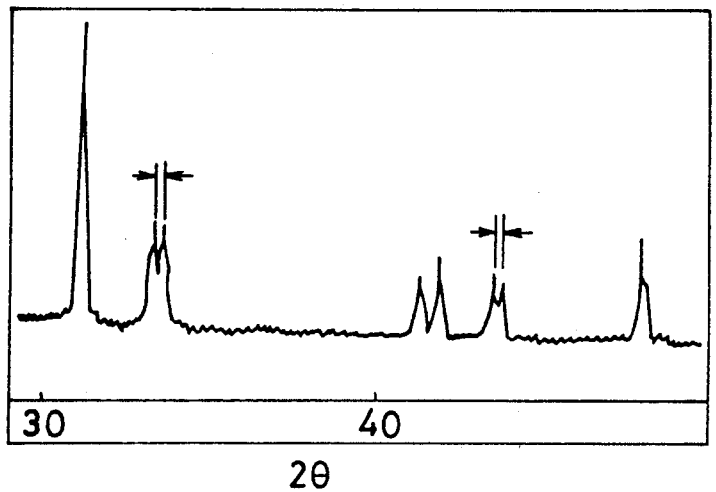
FIG. 4($a$) is a graph showing the x-ray diffraction pattern of a La-Cu-O oxide material before electrolysis.

After completion of the electrolysis, the oxide material was removed of water and subjected to x-ray diffraction analysis. The results are shown in FIG. 4(a). The x-ray diffraction pattern of the same material before electrolysis is shown in FIG. 4(b) for comparison.

Figure 4B:
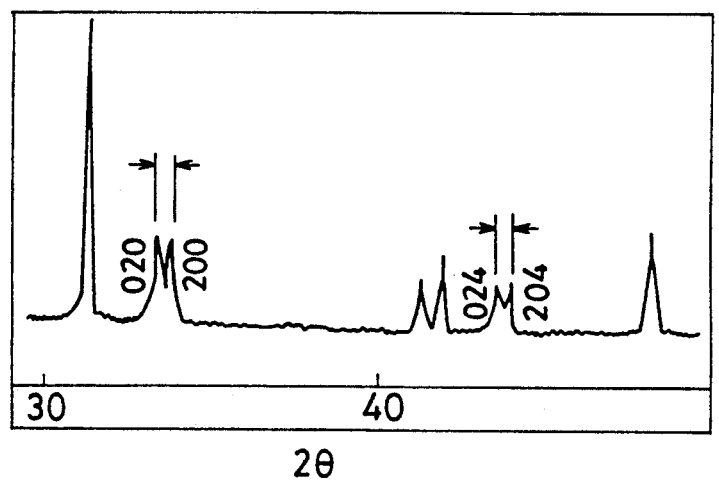

A comparison of the x-ray diffraction results shown in FIGS. 4(a) and 4(b) shows that the processing in accordance with the invention produced a marked increase in bandwidth, indicating an improvement in the critical state of the superconductor.

Figure 5:
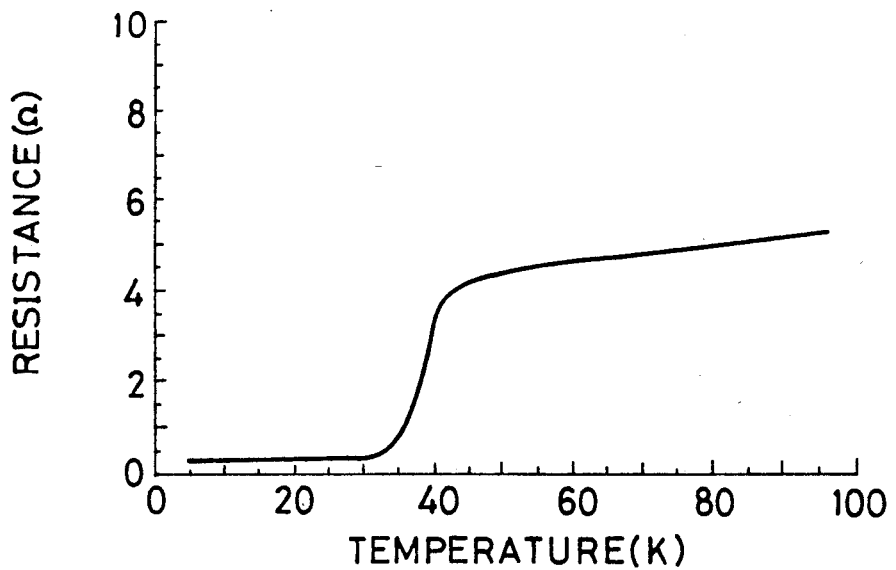
FIG. 5 is a graph showing the critical temperature of an oxide material processed by the method of this invention.

The critical temperature of the oxidized material was measured. The result is shown in FIG. 5. While the superconductivity of the oxide material La-Cu-O prior to processing is semiconductor, it will be noted that the processed material exhibited a sharp decrease in resistance and assumed a superconductive state in the vicinity of 40 K. in terms of offset.

For comparison, an oxide material of the same type as the foregoing was subjected to oxidization processing at a potential controlled to the negative side of the redox potential of copper (II/I) (i.e. to the reduction side: −0.1 V vs the saturated calomel electrode). In this case the processed material exhibited a smaller bandwidth than that shown for the pre-processed material in FIG. 4(a) and failed to exhibit superconductivity.

In another test, two oxide materials that had been subjected to the aforesaid electrolysis and which exhibited superconductivity were subjected to further electrolysis, one at 2 V and one at 1.8 V. The first material electrolyzed at 2 V vigorously produced oxygen from its surface and disintegrated after about 12 hours, making it impossible to measure its critical temperature.

After being electrolyzed for 12 hours at 1.8 V the second material exhibited the C.V. curve indicated by c in FIG. 2. It will be noted that the slope of the C.V. curve became nearly flat. The material had very low conductivity and did not exhibit superconductivity.

Figure 6:
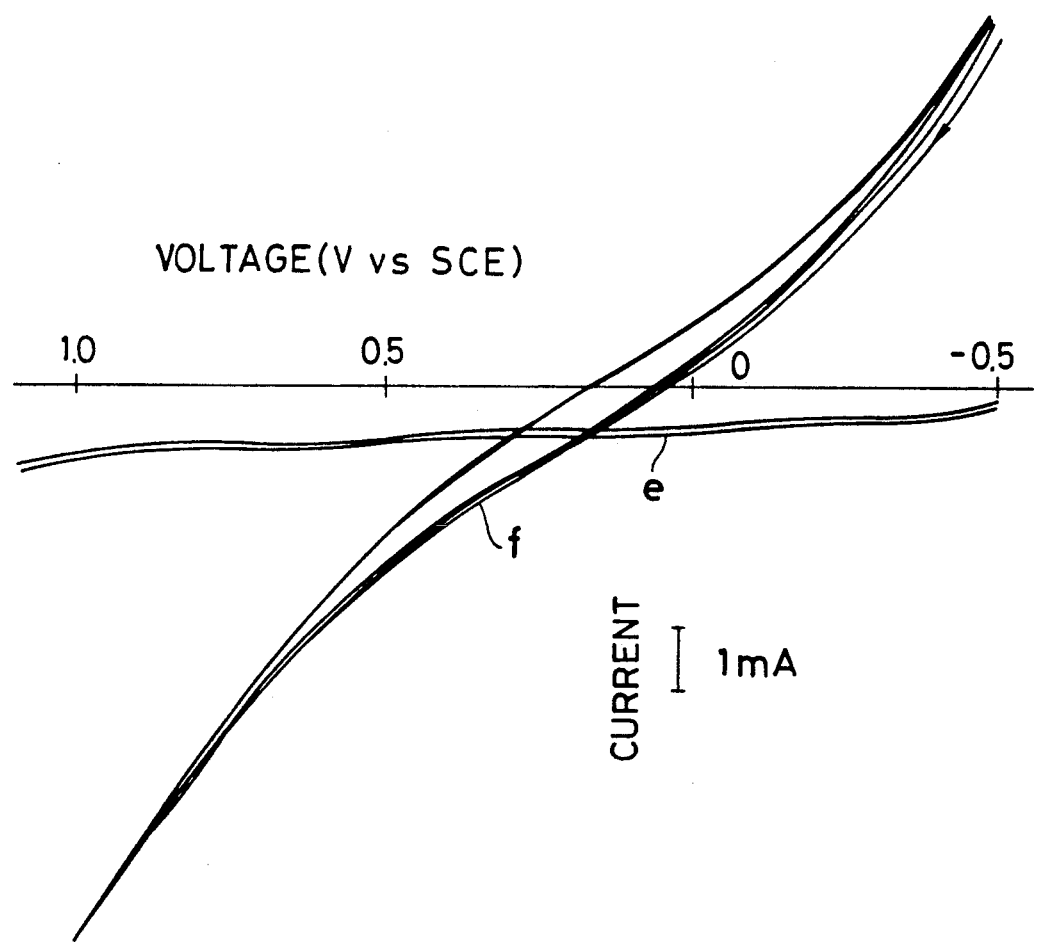
FIG. 6 is the C.V. curve of a failure example of the processing of an oxide material.

Next, following the prior art method disclosed in the literature reference mentioned earlier, an oxide material of the same kind was electrolyzed for 9 hours at a potential equivalent to 0.45 V (vs a mercury oxide electrode). The C.V. curves of this oxide material before and after electrolysis are indicated in FIG. 6 as f and e. It will be noted that the processing caused a drop in conductivity. Moreover, the split width also decreased and the processed material did not exhibit a critical temperature.

EXAMPLE 2

Figure 7:
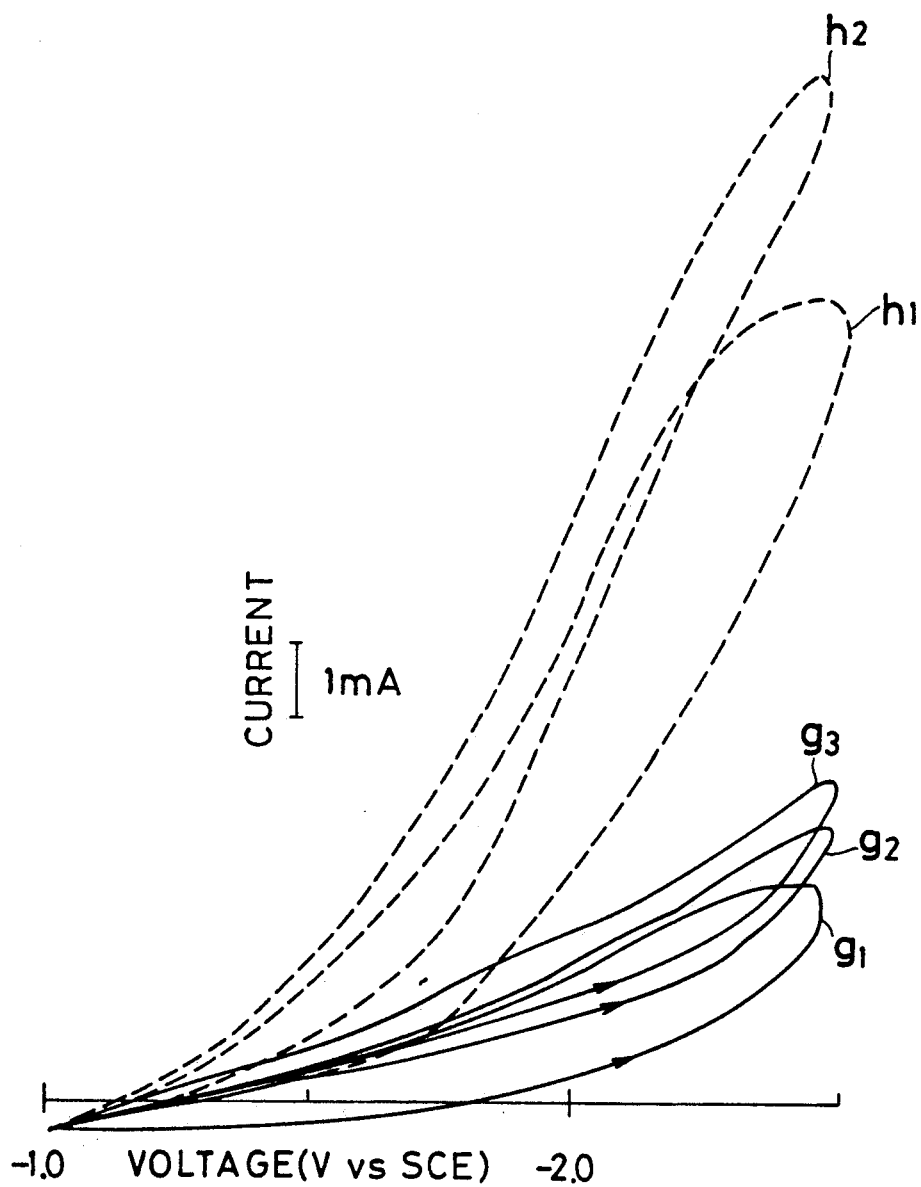
FIG. 7 is a graph showing the C.V. curves of Bi-Pb-Ca-Cu oxide materials.

A bismuth-lead-strontium-calcium-copper (Bi-Pb-Sr-Ca-Cu) oxide having a critical temperature of 70 K. was used as an electrode. At room temperature, on the electrode of the material, a voltage was repeatedly swept over the range of −1.0 V to −2.5 V (vs the saturated calomel electrode) for obtaining C.V. curves. The results are shown in FIG. 7. In this figure, $g_1$ indicates the C.V. curve obtained in the first cycle, $g_2$ that obtained in the second cycle and $g_3$ that obtained in the third cycle. It was noted that the current value increased with each succeeding sweep cycle within the specified voltage range. From this it can be concluded that electrolysis of the material in the −2.0 V to −2.5 V voltage range is effective for increasing its conductivity.

Next, an oxide material of the same type but having a critical temperature of 106 K. was selected. This superconductor was used as an electrode and at room temperature applied with a voltage repeatedly swept over the same range of −1.0 V to −2.5 V (vs the saturated calomel electrode) for obtaining C.V. curves. In FIG. 7, $h_1$ indicates the C.V. curve obtained in the first cycle, $h_2$ that obtained in the second cycle and $h_3$ that obtained in the third cycle.

FIG. 7 shows that at room temperature the superconductor with the higher critical temperature (106 K.) passed more current than the superconductor with the lower critical temperature (70 K.). It is thus possible to estimate the critical temperatures of a plurality of superconductors by comparing their C.V. curves.

EXAMPLE 3

A La-Cu-O oxide material produced by the method of Example 1 was used as an electrode in an electrolyte prepared by dissolving potassium hydroxide in an organic solvent, namely commercially available higher ethanol, so as to obtain a 0.5M solution and electrolysis was performed for 20 hours with a voltage of 2 V applied between the oxide material electrode and the platinum electrode. As a result, the critical temperature of the oxide material came to exhibit a critical temperature of 38 K., showing that the critical temperature of an oxide material can also be increased by electrolysis in an organic solvent.

What is claimed is:

1. A method for producing an oxide superconductor comprising obtaining a cyclic voltammogram in an electrolyte using an oxide material containing an element having a redox charge as an electrode, determining an electrolytic potential for the oxide material on the basis of the voltammogram, and electrolyzing the oxide material at the determined potential wherein the electrolytic potential is determined from the oxide material's cyclic voltammogram as one which satisfies the following conditions:
   1) that at electrolysis temperature the difference between oxidation and reduction currents is large and
   2) at least one of the oxidation current and the reduction current flows.

2. The method for producing an oxide superconductor according to claim 1, wherein the oxide material is a material containing at least one of alkaline earth metal ions, alkali metal ions, hydroxide ions, sulfate ions and halogen compound ions.

3. The method for producing an oxide superconductor according to claim 2, wherein the electrolyte contains at least one of alkali metal ions, alkali hydroxide ions, sulfate ions and halogen compound ions and the ions are intercalated between layers of the oxide material during electrolysis.

4. The method for producing an oxide superconductor according to claim 1, wherein the electrolyte is an aqueous solution of an alkaline salt, an organic solvent having an akane salt dissolved therein, or fused salts having a low fusion temperature.

5. The method for producing an oxide superconductor according to claim 3, wherein the electrolyte is an aqueous solution of an alkaline salt, an organic solvent having an alkaline salt dissolved therein, or fused salts having a low fusion temperature.

6. The method for producing an oxide superconductor according to claim 1, wherein the oxide material is a lanthanum-copper-oxygen oxide, a rare earth metal-copper-oxygen, an alkaline earth metal-copper-oxygen or an alkali metal-copper-oxygen.

7. The method for producing an oxide superconductor according to claim 1, wherein the oxide material is a lanthanum-alkaline earth metal-copper-oxygen oxide.

8. The method for producing an oxide superconductor according to claim 1, wherein the oxide material is a bismuth-lead-strontium-calcium-copper-oxygen oxide.

9. The method for producing an oxide superconductor according to claim 1, wherein said oxide material consists essentially of lanthanum, copper and oxygen and wherein said electrolysis is conducted at from 0.7–1.0 V versus saturated calomel electrode.

10. The method for producing an oxide superconductor according to claim 9, wherein said electrolysis is conducted at 0.9–1.0 V versus saturated calomel electrode.

11. The method for producing an oxide superconductor according to claim 9, wherein the oxide superconductor exhibits a critical temperature of 40 K.

12. A method for producing an oxide superconductor comprising obtaining a cyclic voltammogram in an electrolyte using an oxide material containing an element having a redox charge as an electrode, determining an electrolytic potential for the oxide material on the basis of the voltammogram, electrolyzing the oxide material at the determined potential while monitoring current and terminating electrolysis when said current stops rising and begins to fall.

* * * * *